United States Patent
Kuo et al.

(10) Patent No.: US 10,365,894 B2
(45) Date of Patent: Jul. 30, 2019

(54) RANDOM NUMBER GENERATOR

(71) Applicant: Intel Corporation, Santa Clara, CA (US)

(72) Inventors: Charles C. Kuo, Hillsboro, OR (US); Justin S. Brockman, Portland, OR (US); Juan G. Alzate Vinasco, Portland, OR (US); Kaan Oguz, Beaverton, OR (US); Kevin P. O'Brien, Portland, OR (US); Brian S. Doyle, Portland, OR (US); Mark L. Doczy, Portland, OR (US); Satyarth Suri, Portland, OR (US); Robert S. Chau, Beaverton, OR (US); Prashant Majhi, San Jose, CA (US); Ravi Pillarisetty, Portland, OR (US); Elijah V. Karpov, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/575,334

(22) PCT Filed: Jun. 17, 2015

(86) PCT No.: PCT/US2015/036266
§ 371 (c)(1),
(2) Date: Nov. 17, 2017

(87) PCT Pub. No.: WO2016/204750
PCT Pub. Date: Dec. 22, 2016

(65) Prior Publication Data
US 2018/0165065 A1 Jun. 14, 2018

(51) Int. Cl.
G06F 7/58 (2006.01)
H01L 43/02 (2006.01)
H01L 43/08 (2006.01)

(52) U.S. Cl.
CPC .............. G06F 7/588 (2013.01); H01L 43/02 (2013.01); H01L 43/08 (2013.01)

(58) Field of Classification Search
CPC .......... G06F 7/588; H01L 43/02; H01L 43/08
USPC .................................................. 708/250–256
See application file for complete search history.

(56) References Cited

U.S. PATENT DOCUMENTS

| | | |
|---|---|---|
| 2010/0174766 A1 | 7/2010 | Weeks et al. |
| 2011/0123022 A1 | 5/2011 | Oishi et al. |
| 2011/0194337 A1* | 8/2011 | Wang ..................... B82Y 25/00 365/158 |

(Continued)

OTHER PUBLICATIONS

International Search Report and Written Opinion for International Patent Application No. PCT/US15/36266, dated Apr. 29, 2016.

(Continued)

*Primary Examiner* — Tan V Mai
(74) *Attorney, Agent, or Firm* — Green, Howard & Mughal LLP (57) ABSTRACT

Described is an apparatus which comprises: a magnetic tunneling junction (MTJ) device with out-of-plane magnetizations for its free and fixed magnetic layers, and configured to have a magnetization offset away from a center and closer to a switching threshold of the MTJ device; and logic for generating random numbers according to a resistive state of the MTJ device.

14 Claims, 9 Drawing Sheets

(56) References Cited

U.S. PATENT DOCUMENTS

| | | |
|---|---|---|
| 2011/0303997 A1 | 12/2011 | Wang et al. |
| 2012/0205758 A1 | 8/2012 | Jan et al. |
| 2013/0073598 A1* | 3/2013 | Jacobson ................ G06F 7/588 |
| | | 708/252 |
| 2013/0135925 A1 | 5/2013 | Scheuerlein |
| 2014/0022837 A1 | 1/2014 | Wang et al. |
| 2014/0067890 A1 | 3/2014 | Zhu et al. |
| 2014/0175582 A1 | 6/2014 | Apalkov et al. |
| 2018/0239590 A1* | 8/2018 | Gupta ..................... G06F 7/588 |

OTHER PUBLICATIONS

International Preliminary Report on Patentability for International Patent Application No. PCT/US2015/036266, dated Dec. 28, 2017.
Kim, J. et al., "Spin-Based Computing: Device Concepts, Current Status, and a Case Study on a High-Performance Microprocessor", Proceedings of the IEEE, vol. 103, Issue: 1, Jan. 2015, pp. 106-130, Publication date: Nov. 26, 2014, DOI: 10.1109/JPROC.2014.2361767.

* cited by examiner

RANDOM NUMBER GENERATOR

CLAIM OF PRIORITY

This Application is a National Stage Entry of, and claims priority to, PCT Application No. PCT/US15/36266, filed on 17 Jun. 2015 and titled "RANDOM NUMBER GENERATOR," which is incorporated by reference in its entirety for all purposes.

BACKGROUND

Random number generators generate a sequence of numbers or symbols that lack order and appear random. For example, the sequence of numbers or symbols generated by the random number generators lack any pattern. Random number generators have many applications. For example, random number generators may be used for improving encryption in hardware security, for statistical sampling, cryptography, gambling, computer simulations, etc.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Some embodiments describe a random number generator which comprises a magnetic tunneling junction (MTJ) device with out-of-plane magnetizations for its free and fixed magnetic layers, and configured to have a magnetization offset ($H_{offset}$) away from a center and closer to a switching threshold of the MTJ device. Here, the MTJ with out-of-plane magnetizations is also referred to as the p-MTJ. In some embodiments, the random number generator comprises logic for generating random numbers according to a resistive state of the p-MTJ device.

In some embodiments, the p-MTJ is biased so that the p-MTJ has a high resistive state (i.e., the magnetizations of the free and fixed layers are anti-parallel (AP) to each other). Then, current is injected into the p-MTJ to cause spin current to flow in the free magnetic layer such that the magnetization of the free magnetic layer switches from AP to parallel (i.e., parallel to the direction of magnetization of the fixed magnetic layer). In some embodiments, the anti-damping Spin Transfer Torque (STT) competes with the $H_{offset}$ and/or thermal relaxation of the p-MTJ to switch the resistive state back to AP and thus generate random current. The stability of the p-MTJ can be considered to be analogous (for purposes of explaining) to activation energy. This means that there is a finite probability at any ambient temperature that the bit stored in the p-MTJ can overcome the activation energy barrier and flip its state. As such, the output current changes (i.e., oscillates). This output current oscillation is sensed by the logic which generates corresponding random numbers.

In some embodiments, a random number generator is provided which comprises a Metal-Insulator-Metal (MIM) device that exhibits a S-shaped negative differential resistance (NDR), where the MIM device is biased at its threshold current. In some embodiments, the random number generator comprises logic coupled to the MIM device to sense a voltage across the MIM device and to generate random numbers according to the sensed voltage.

In some embodiments, a random number generator is provided which comprises a MIM device biased at a high resistance state, and logic coupled to the MIM device to sense a current through the MIM device and to generate random numbers according to the sensed current.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical, or wireless connection between the things that are connected, without any intermediary devices. The term "coupled" means either a direct electrical or wireless connection between the things that are connected or an indirect electrical or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
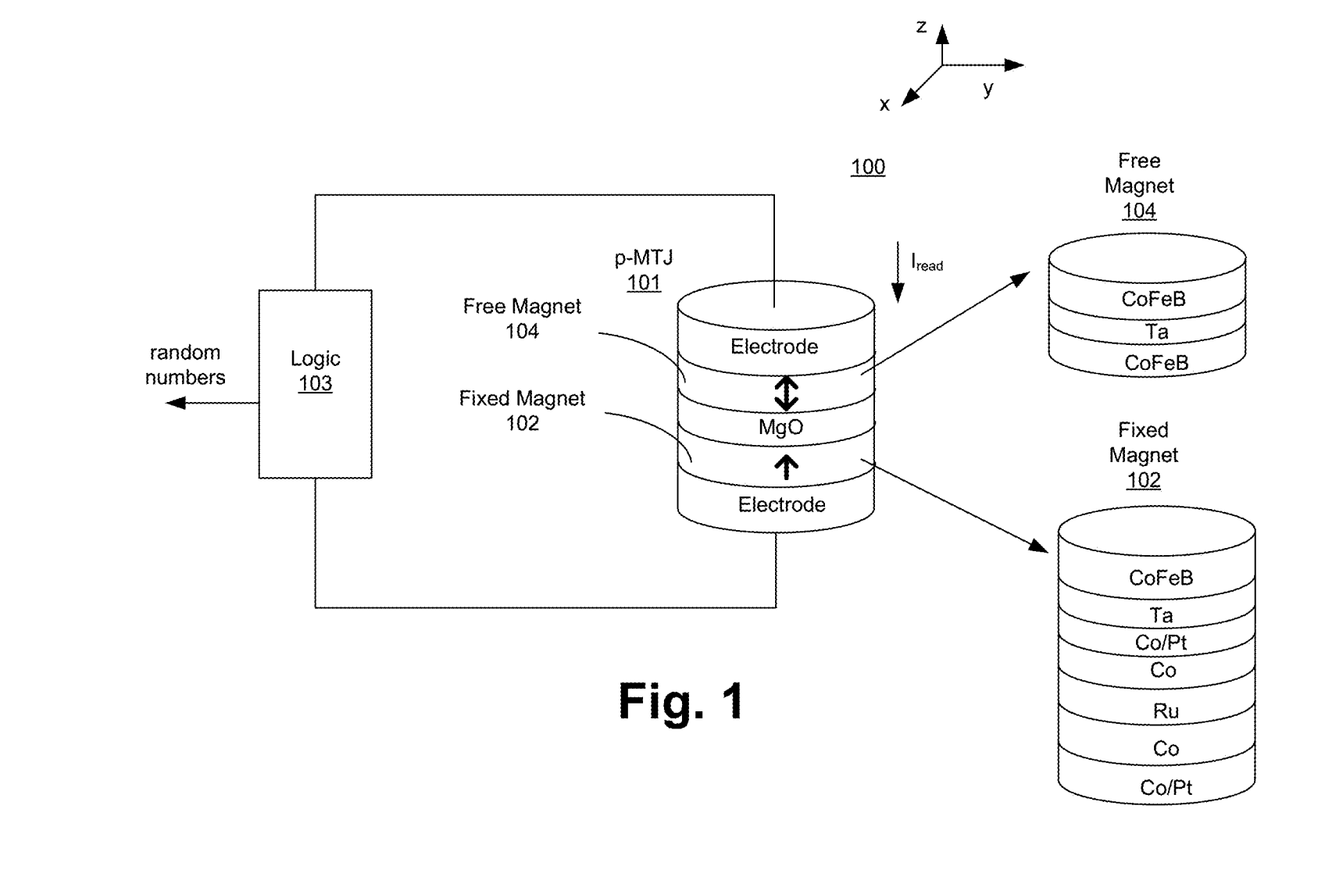
FIG. 1 illustrates a random number generator with perpendicular magnetic tunnel junction (p-MTJ), according to some embodiments of the disclosure.

FIG. 1 illustrates random number generator 100 with p-MTJ, according to some embodiments of the disclosure. In some embodiments, random number generator 100 comprises p-MTJ 101 and Logic 103. In some embodiments, p-MTJ 101 comprises top and bottom electrodes, Fixed Magnet layer 102, Free Magnet layer 104, and insulator (or tunneling dielectric) sandwiched between Fixed Magnet layer 102 and the Free Magnet layer 104. In some embodiments, the magnetization orientation of Fixed Magnet layer 102 and Free Magnet layer 104 is out-of-plane in the z-direction (i.e., perpendicular to the plane of the magnets, hence referred to as p-MTJ). In some embodiments, a spin valve is formed by stacking a ferromagnetic layer (e.g., Fixed Magnet layer 102) with a tunneling dielectric and another ferromagnetic layer (e.g., Free Magnet layer 104).

A wide combination of materials can be used for material stacking of p-MTJ 101. In some embodiments, the stack of materials include: Ru, Ta, MgO, CoFeB, Ta, CoFeB (where CoFeB, Ta, and CoFeB together form Free Magnetic layer 104), MgO (i.e., tunneling oxide), CoFeB, Ta, Co/Pt, Co, Ru, Co, and Co/Pt (where CoFeB, Ta, Co/Pt, Co, Ru, Co, and Co/Pt form Fixed Magnetic layer 102).

In some embodiments, the thickness of Fixed Magnet layer 102 determines its magnetization direction. For example, when the thickness of Fixed Magnet layer 102 is above a certain threshold (depending on the material of the magnet, e.g., approximately 1.5 nm for CoFe), then Fixed Magnet layer 102 exhibits magnetization direction which is in-plane. Likewise, when the thickness of Fixed Magnet layer 102 is below a certain threshold (depending on the material of the magnet), then Fixed Magnet layer 102 exhibits magnetization direction which is perpendicular to the plane of the magnetic layer. In some embodiments, thickness of Free Magnetic Layer 104 also determines its magnetization direction in the same manner as in the thickness of Fixed Magnet layer 102. Here, magnetization directions of Fixed Magnet layer 102 and Free Magnetic layer 104 are out-of plane.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

In some embodiments, p-MTJ 101 is configured to have a magnetization offset ($H_{offset}$) away from a center and closer to a switching threshold of p-MTJ 101. In some embodiments, when STT causes Free Magnet layer 104 to switch from low resistive state (i.e., when both Fixed Magnet layer 102 and Free Magnet layer 104 have parallel magnetization orientations), $H_{offset}$ in conjunction with thermal energy causes p-MTJ 101 to switch to a high resistive state (i.e., when both Fixed Magnet layer 102 and Free Magnet layer 104 have anti-parallel magnetization orientations). As such, random oscillations in current through p-MTJ 101 are detected. These random oscillations can be used to generate random numbers, in accordance to some embodiments.

Figure 2A:
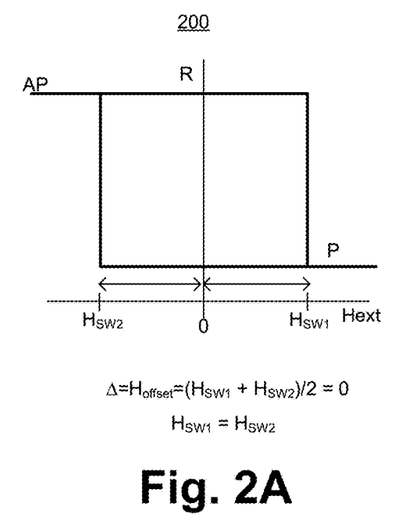
FIG. 2A illustrates a plot showing a fixed magnet with zero magnetic offset ($H_{offset}$).
Figure 2B:
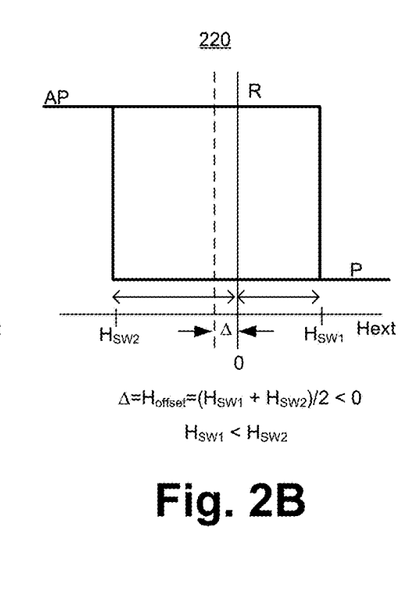
FIG. 2B illustrates a plot showing a fixed magnet with negative $H_{offset}$ for use in the p-MTJ of FIG. 1, according to some embodiments of the disclosure.
Figure 2C:
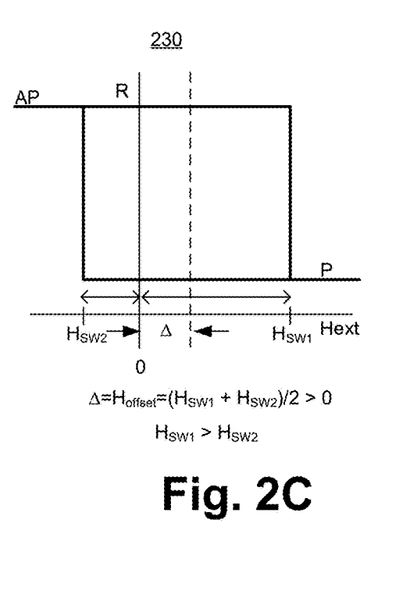
FIG. 2C illustrates a plot showing a fixed magnet with positive $H_{offset}$ for use in the p-MTJ of FIG. 1, according to some embodiments of the disclosure.

FIGS. 2A-C illustrate magnetic hysteresis plots 200, 220, and 230 showing zero and non-zero $H_{offset}$, where the non-zero $H_{offset}$ is used for generating random current switching in p-MTJ 101, in accordance to some embodiments.

FIG. 2A illustrates hysteresis plot 200 showing a fixed magnet with zero magnetic offset ($H_{offset}$). Here, x-axis is magnetic field (Hext) that passes through a p-MTJ, and y-axis is the resistance across the p-MTJ. High resistance occurs when both the fixed magnet layer and the free magnet layer of a p-MTJ have anti-parallel (AP) magnetization orientations, while low resistance occurs when both the fixed magnet layer and the free magnet layer of a p-MTJ have parallel (P) magnetization orientations. Switching states between AP and P orientations occurs at two separate magnetic switching fields—$H_{SW1}$ and $H_{SW2}$, where $H_{SW1}$ is a positive magnetic switching field and $H_{SW2}$ is a negative magnetic switching field. $H_{offset}$ can be expressed as:

$$\Delta = H_{offset} = (H_{SW1} + H_{SW2})/2$$

$H_{offset}$ shown in hysteresis plot 200 is zero because the magnitudes of $H_{SW1}$ and $H_{SW2}$ are equal relative to the zero point. Typical MTJs have zero $H_{offset}$. In some embodiments, $H_{offset}$ is configured to be non-zero as described with reference to FIGS. 2B-C to generate random current switching in p-MTJ 101.

FIG. 2B illustrates hysteresis plot 220 showing a fixed magnet with negative $H_{offset}$ for use in p-MTJ 101 of FIG. 1, according to some embodiments of the disclosure. It is pointed out that those elements of FIG. 2B having the same reference numbers (or names) as the elements of any other figure can operate or function in any manner similar to that described, but are not limited to such. The $H_{offset}$ shown in hysteresis plot 220 is negative because the magnitude of $H_{SW2}$ is larger than the magnitude of $H_{SW1}$ relative to the zero point. The difference in the switching magnetic fields is A.

FIG. 2C illustrates plot 230 showing a fixed magnet with positive $H_{offset}$ for use in p-MTJ 101 of FIG. 1, according to some embodiments of the disclosure. It is pointed out that those elements of FIG. 2C having the same reference numbers (or names) as the elements of any other figure can operate or function in any manner similar to that described, but are not limited to such. The $H_{offset}$ shown in hysteresis plot 230 is positive because the magnitude of $H_{SW1}$ is larger than the magnitude of $H_{SW2}$ relative to the zero point. The difference in the switching magnetic fields is A.

Figure 2D:
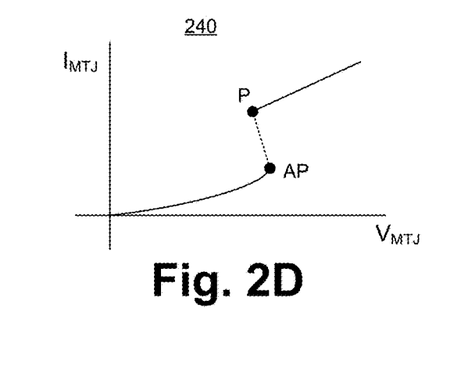
FIG. 2D illustrates a current-voltage (IV) plot showing change in resistive states of the p-MTJ.

FIG. 2D illustrates current-voltage (IV) plot 240 showing change in resistive states of p-MTJ 101. Here, x-axis is voltage across p-MTJ 101 (i.e., $V_{MJ1}$) and y-axis is current through p-MTJ 101 (i.e., IMTJ). As voltage is applied across p-MTJ 101, current begins to flow through it. During AP state (i.e., a high resistance state), negligible current or very small current flows through, while during the P state (i.e., a low resistance state) current begins to increase as $V_{MTJ}$ increases (i.e., higher $V_{MTJ}$ results in more anti-damping STT and faster switching currents). In some embodiments, the anti-damping STT competes with the $H_{offset}$ and/or thermal relaxation of p-MTJ 101 to switch the resistive state back to AP and thus generate random current.

The stability of p-MTJ 101 can be considered to be analogous (for purposes of explaining) to activation energy. This means that there is a finite probability at any ambient temperature that the bit stored in p-MTJ 101 can overcome the activation energy barrier and flip its state. As such, the output current changes (i.e., oscillates). This output current oscillation is sensed by the logic which generates corresponding random numbers. Once p-MTJ 101 switches from AP state to P state, it may not switch again for an ideal device under the same polarity. Here, $H_{offset}$ situates the bit near a switching field (in this case, $H_{sw2}$), while thermal energy enables the bit to switch.

Figures 3A, 3B:
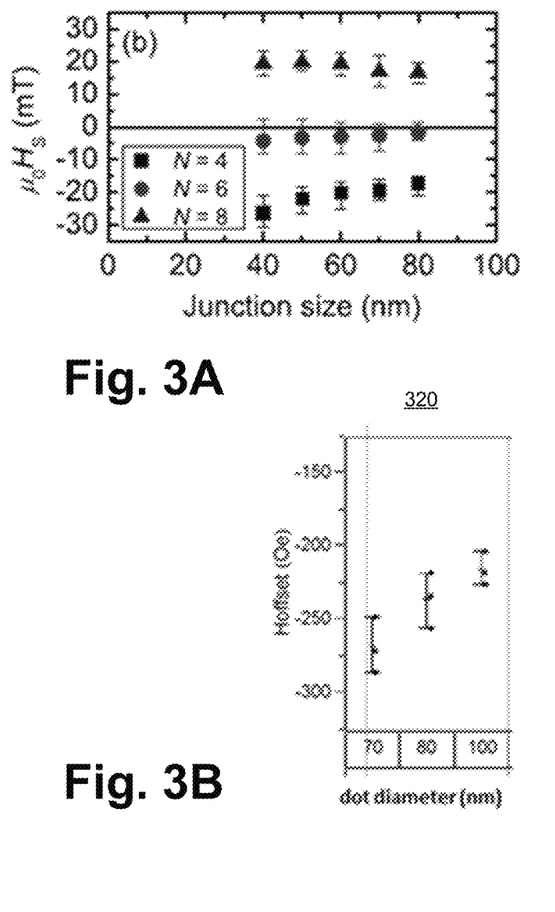
FIG. 3A illustrates a plot showing the effects of the number of layers, which form a fixed magnetic layer, on $H_{offset}$ to configure the p-MTJ to generate random numbers, according to some embodiments of the disclosure.
FIG. 3B illustrates a plot showing the effects of the p-MTJ diameter size on $H_{offset}$ to configure the p-MTJ to generate random numbers, according to some embodiments of the disclosure.

In some embodiments, $H_{offset}$ for p-MTJ 101 is configured to change (e.g., made positive or negative) by changing the number of layers used to form Fixed Magnetic layer 102 as shown with reference to FIG. 3A. FIG. 3A illustrates plot 300 showing the effects of the number of layers 'N', which forms a fixed magnetic layer, on $H_{offset}$ to configure p-MTJ 101 to generate random numbers, according to some embodiments of the disclosure. Here, x-axis is Junction size in nanometers (nm) while y-axis is wHs (which corresponds to $H_{offset}$) in milli Tesla (mT). Junction size indicates the diameter of Fixed Magnet layer 102. For a fixed junction size, as the number of layers 'N' forming the Co/Pt multi-layers furthest away from the MgO layer of Fixed Magnetic layer 102 increases (e.g., from 4 to 8), $H_{offset}$ reduces from a positive number to a negative number.

FIG. 3B illustrates plot 320 showing the effects p-MTJ 101 diameter size on $H_{offset}$ to configure p-MTJ 101 to generate random numbers, according to some embodiments of the disclosure. Here, x-axis is a diameter of Fixed Magnetic layer 102 in nm while y-axis is $H_{offset}$ in Oersted (Oe). In some embodiments, as the diameter of Fixed Magnetic layer 102 increases (e.g., from 70 nm to 100 nm), $H_{offset}$ increases (i.e., becomes more positive).

While the embodiments describe changing $H_{offset}$ with reference to changing number of layers for Fixed Magnet layer 102 or the diameter of Fixed Magnet layer 102, other techniques may be used. For example, the material type may be changed or the thicknesses of the individual layers may be changed in conjunction with or without changing the number of layers for Fixed Magnet layer 102 or the diameter of Fixed Magnet layer 102. In some embodiments, $H_{offset}$ is configured to be close to the switching edge of p-MTJ 101 so that thermal energy can enable the bit to switch.

Figure 4A:
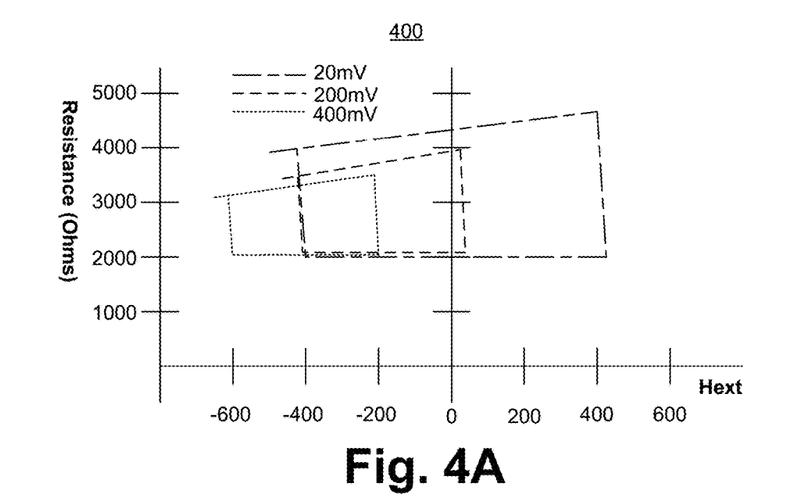
FIG. 4A illustrates a plot with various magnetic hysteresis for different p-MTJ biasing.

FIG. 4A illustrates plot 400 with various magnetic hysteresis for different p-MTJ biasing. It is pointed out that those elements of FIG. 4A having the same reference numbers (or names) as the elements of any other figure can operate or function in any manner similar to that described, but are not limited to such. Here, x-axis is magnetic field Hext while y-axis is Resistance in Ohms. Plot 400 illustrates magnetic hysteresis like plots 200, 220, and 230, but for various $V_{MTJ}$ settings (e.g., 20 mV, 200 mV, and 400 mV respectively). The window size (e.g., the inner opening) of the hysteresis plot changes with different $V_{MTJ}$ and magnetic field. STT causes bit to flip from AP state to P state. Here, $H_{offset}$ brings it to—$H_{SW}$ and thermal relaxation causes the bit to flip from P state to AP state.

Figure 4B:
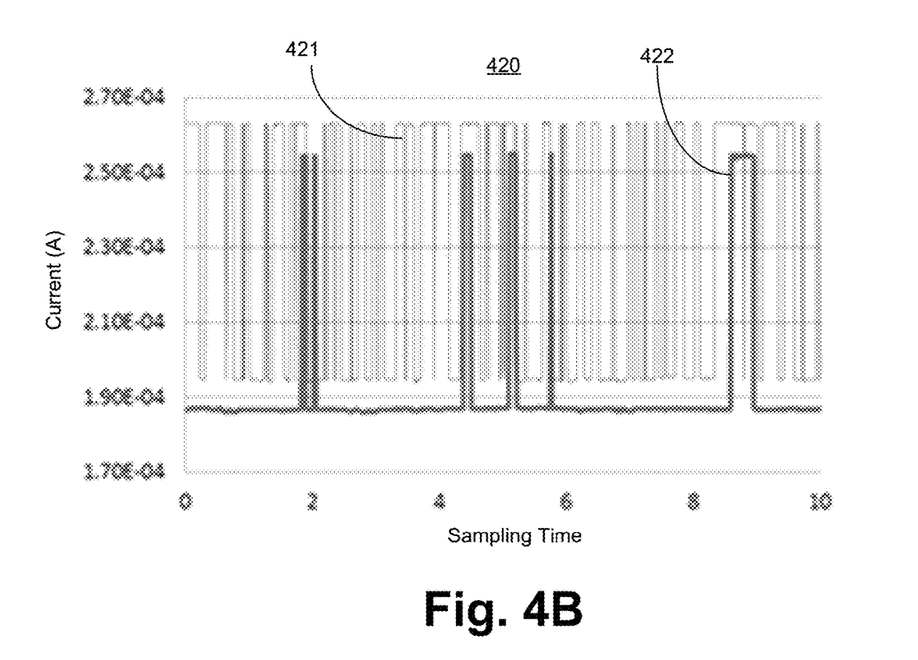
FIG. 4B illustrates a plot showing random switching current for two different p-MTJ biasing, according to some embodiments of the disclosure.

FIG. 4B illustrates plot 420 showing random switching current for two different p-MTJ biasing, according to some embodiments of the disclosure. It is pointed out that those elements of FIG. 4B having the same reference numbers (or names) as the elements of any other figure can operate or function in any manner similar to that described, but are not limited to such. Here, x-axis is sampling time (in milliseconds (ms)) while y-axis is current in Amperes (A).

In some embodiments, $V_{MTJ}$ is set so that p-MTJ 101, with $H_{offset}$ close to the switching edge of p-MTJ 101, is initially in high resistance state (i.e., AP state) and then current I is provided to p-MTJ 101 to cause it to switch, via STT, to a low resistance state (i.e., P state). $H_{offset}$ situates the bit stored in p-MTJ 101 near a switching field (e.g., $H_{sw2}$) while thermal energy enables the bit to switch, in accordance with some embodiments. This switching is random, according to some embodiments. The switching is function of $V_{MTJ}$, $H_c$, and $H_{offset}$, where "$H_c$" is coercivity. Coercivity generally refers to the intensity of the applied magnetic field required to reduce the magnetization of that material to zero after the magnetization of the sample has been driven to saturation. Coercivity may also refer to the external magnetic field required, along the easy axis, to switch the magnetization of the material.

Plot 420 illustrates two switching speeds for two different $V_{MTJ}$. Current 421 is generated with $V_{MTJ}$ 680 mV while current 422 is generated with $V_{MTJ}$ at 690 mV. In some embodiments, by adjusting the bias voltage $V_{MTJ}$, $H_c$, and/or $H_{offset}$, the randomness of the switching current can be modified. In some embodiments, this switching current is then sensed by Logic 103 to generate random numbers.

Figure 5:
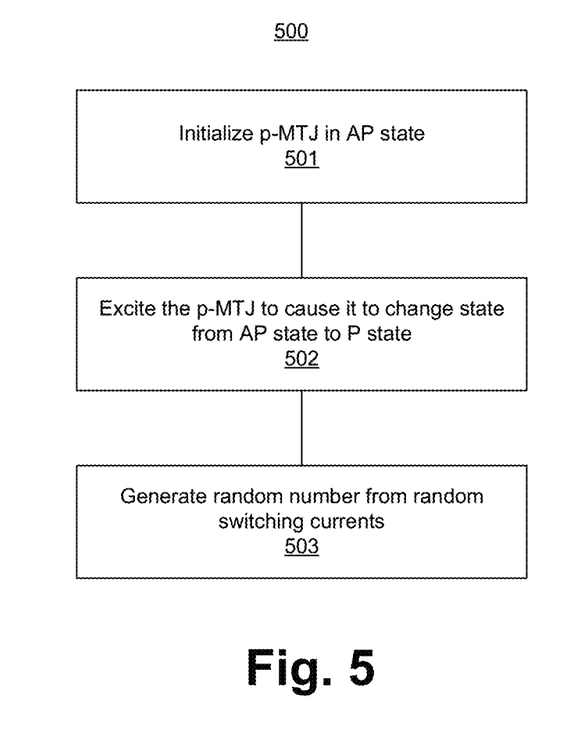
FIG. 5 illustrates a flowchart of a method for generating random numbers using p-MTJ, according to some embodiments of the disclosure.

FIG. 5 illustrates flowchart 500 of a method for generating random numbers using p-MTJ 101, according to some embodiments of the disclosure. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, p-MTJ 101, with configured $H_{offset}$ which is close to the switching edge of p-MTJ 101, is initialized to be in high resistance state (i.e., AP state). Here, switching edge generally refers to the condition of p-MTJ 101 that can switch from a high resistance state to a low resistance state with a very small change in $V_{MTJ}$ (e.g., less than 1V but greater than 10 mV). p-MTJ 101 switches from a high resistance to a low resistance state with current using the physical phenomena of STT. High resistance state (e.g., 10 kilo Ohms) is achieved when the magnetization directions/orientations for Fixed Magnet layer 102 is anti-parallel (AP) to that of Free Magnet layer 104. During this state, less current flows through p-MTJ 101.

At block 502, p-MTJ 101 is excited via input current 'I' such that STT causes Free Magnet layer 104 to switch its magnetic orientation. As such, the resistance state of p-MTJ 101 changes from a high resistance state to a low resistance state. Low resistance state is achieved when the magnetization directions/orientations for Fixed Magnet layer 102 is parallel (P) to that of Free Magnet layer 104. During this state, higher current flows through p-MTJ 101.

At block 503, random switching occurs. $H_{offset}$ situates the bit stored in p-MTJ 101 near a switching field (e.g., $H_{sw2}$) while thermal energy enables the bit to switch, in accordance with some embodiments. This switching is random (which results in random switching current), according to some embodiments. As such, random switching current is sensed at a terminal of p-MTJ 101. This random current is then used as a seed by Logic 103 to generate random numbers, in accordance to some embodiments.

Figure 6:
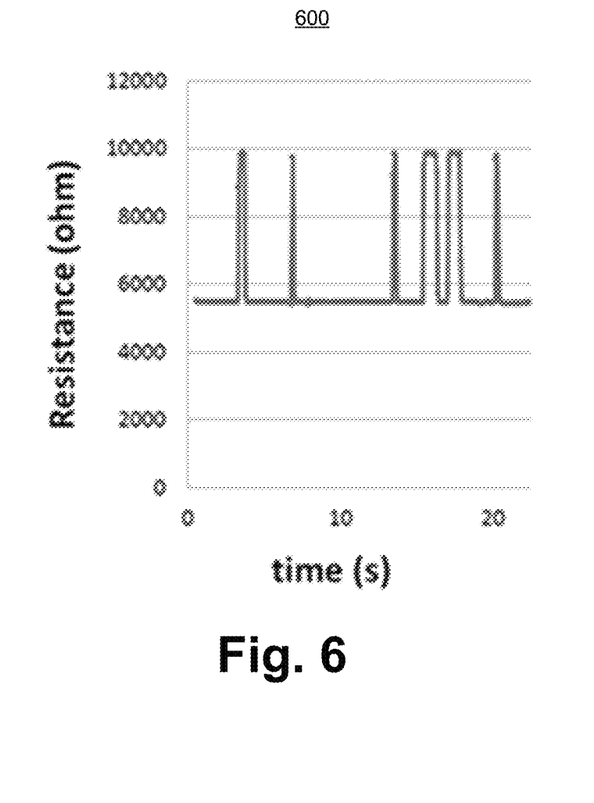
FIG. 6 illustrates a plot showing a p-MTJ with a size small enough to achieve low thermal stability to cause random switching, according to some embodiments of the disclosure.

FIG. 6 illustrates plot 600 showing p-MTJ 101 with a size small enough to achieve low thermal stability to cause random switching, according to some embodiments of the disclosure. It is pointed out that those elements of FIG. 6 having the same reference numbers (or names) as the elements of any other figure can operate or function in any manner similar to that described, but are not limited to such. Here, x-axis is time and y-axis is resistance.

In some embodiments, the size (e.g., diameter of Fixed Magnet layer 102) is configured to be suitable enough to cause random switching by transitioning from a high resistance state to low resistance state. For example, the stability $\Delta_{AVG}$ is made of small enough stability or size to cause random switching of resistance states of p-MTJ 101. In some embodiments, higher $\Delta_{AVG}$ results in lesser volatility while lower $\Delta_{AVG}$ results in higher volatility. For example, for $\Delta_{AVG}$ lower than 21 kT, p-MTJ 101 exhibits higher volatility while for $\Delta_{AVG}$ higher than 21 kT, p-MTJ 101 exhibits higher volatility, where 'k' is Boltzmann constant and 'T' is temperature.

Lesser volatility corresponds to higher retention of data in p-MTJ (i.e., a more stable resistance state once p-MTJ is biased to that resistance state). In some embodiments, for p-MTJs with less volatility, the probability of changing resistance states from high to low or low to high states is low with change in temperature. Higher volatility corresponds to lower retention of data in p-MTJ (i.e., a less stable resistance state once p-MTJ is biased to that resistance state). In some embodiments, for p-MTJs with high volatility, the probability of changing resistance states from high to low or low to high states is high with change in temperature. As such, in some embodiments, the diameter is made small enough to achieve low thermal stability (i.e., higher volatility). In one such embodiment, Logic 103 senses the resistance change in p-MTJ 101 and uses that randomness for generating random numbers.

Figure 7A:
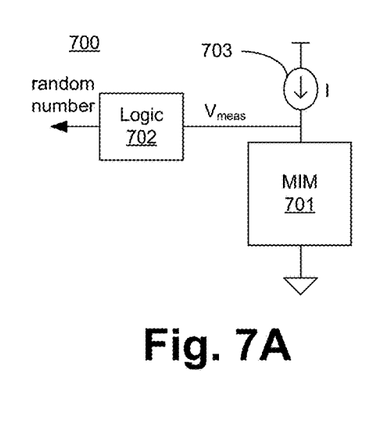
FIG. 7A illustrates a random number generator using a S-shaped Negative Differential Resistance (NDR) device, according to some embodiments of the disclosure.

FIG. 7A illustrates random number generator 700 using an S-shaped Negative Differential Resistance (NDR) device, according to some embodiments of the disclosure. In some embodiments, random number generator 700 comprises Metal-Insulator-Metal (MIM) device 701, Logic 702, and Current Source 703. In some embodiments, MIM device 701 exhibits S-shaped NDR (i.e., IV curves which are S-shaped). In some embodiments, by biasing MIM device 701 near its current threshold ($I_{threshold}$), MIM device 701 oscillates between ON and OFF states in a random fashion. In some embodiments, MIM device 701 is a selector-like device with S-shaped NDR IV curve. In some embodiments, the insulator of MIM device 701 is chalcogenide oxide. In some embodiments, MIM device 701 is a Metal-semiconductor-Metal (MSM) device where 'S' is a chalcogenide. In other embodiments, other types of insulators may be used.

In some embodiments, input current 'I' from Current Source 703 is varied when MIM 701 is biased at $I_{threshold}$. The voltage across MIM 701 is then measured or sensed by Logic 702. This voltage is random (i.e., switches between On and Off states with no particular pattern). In some embodiments, Logic 702 uses these randomly changing voltages to generate random numbers.

Figures 7B, 7D:
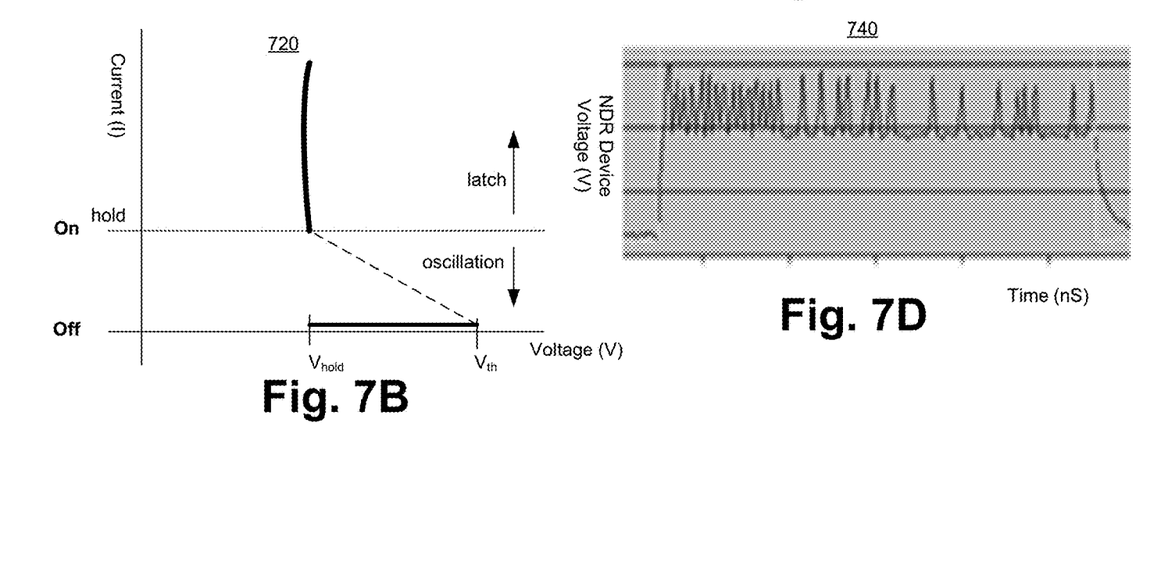
FIG. 7B illustrates a plot showing an IV curve of the S-shaped NDR device, according to some embodiments of the disclosure.
FIG. 7D illustrates a plot showing a transient behavior of the S-shaped NDR device for a static input current, according to some embodiments of the disclosure.

FIG. 7B illustrates plot 720 showing an IV curve of the S-shaped NDR device, according to some embodiments of the disclosure. It is pointed out that those elements of FIG. 7B having the same reference numbers (or names) as the elements of any other figure can operate or function in any manner similar to that described, but are not limited to such. Here, x-axis is voltage (V) and y-axis is Current (I).

As voltage across MIM device 701 increases from $V_{hold}$ to $V_{th}$, MIM device 701 initially remains in Off state and current 'I' is essentially zero through the MIM device 701. As the voltage across MIM device 701 reduces from $V_{th}$ to $V_{hold}$, MIM device 701 begins to conduct some current 'I' and begins to approach the hold state (i.e., the On state). Once the hold state is achieved, MIM device 701 holds on to the data stored in MIM 701 (i.e., behaves as a latch).

In some embodiments, MIM 701 is biased at $I_{threshold}$ (i.e., at hold level on the y-axis of the IV plot) so that as input current 'I' from Current Source 703 varies, the voltage $V_{meas}$ across MIM device 701 oscillates between "latch" and "oscillation" regions. This random oscillation of $V_{meas}$ is sensed by Logic 703 which uses this randomness to generate random numbers, according to some embodiments.

Figure 7C:
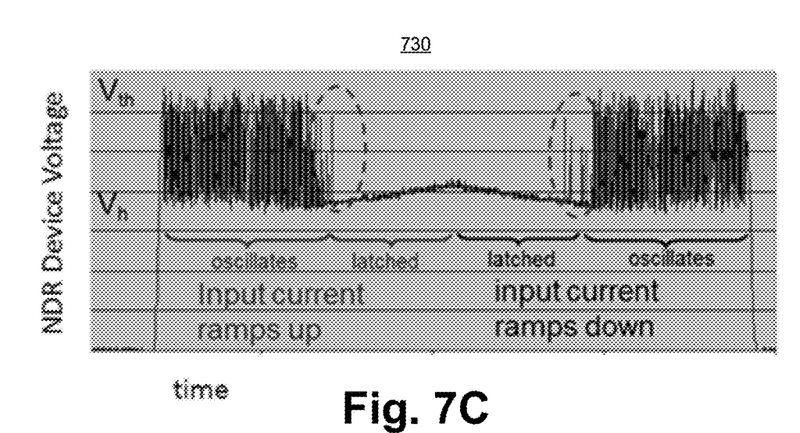
FIG. 7C illustrates a plot showing a transient behavior of the S-shaped NDR device as input current ramps up and down, according to some embodiments.

FIG. 7C illustrates plot 730 showing a transient behavior of the S-shaped NDR device as an input current ramps up and down, according to some embodiments of the disclosure. It is pointed out that those elements of FIG. 7C having the same reference numbers (or names) as the elements of any other figure can operate or function in any manner similar to that described, but are not limited to such.

Here, x-axis is voltage (V) across MIM device 701 and y-axis is time. In this example, after MIM device 701 is biased around $I_{threshold}$, input current 'I' from Current Source 703 is ramped up and then ramped down, and corresponding behavior of MIM device 701 is illustrated. FIG. 7C depicts the nature of oscillations vs. latching. As the input current ramps up (i.e. increases), $V_{meas}$ oscillates between $V_{hold}$ and $V_{th}$, and then stabilizes (i.e., latched). Likewise, as the input current ramps down (i.e., decreases), $V_{meas}$ moves from a stable latched state to begin oscillating between $V_{hold}$ and $V_{th}$ (i.e., oscillation state). The oscillation regions in this transient plot is used to generate random numbers, according to some embodiments.

FIG. 7D illustrates plot 740 showing a transient behavior of the S-shaped NDR device for a static input current, according to some embodiments of the disclosure. It is pointed out that those elements of FIG. 7D having the same reference numbers (or names) as the elements of any other figure can operate or function in any manner similar to that described, but are not limited to such. Here, x-axis is voltage (V) across MIM device 701 and y-axis is time. In this case, input current 'I' from Current Source 703 is fixed. Here, the bit is biased near a threshold which are the circled regions (i.e., dashed circles between oscillations/latched regions). The randomness increases at near-threshold conditions, according to some embodiments.

Figure 8:
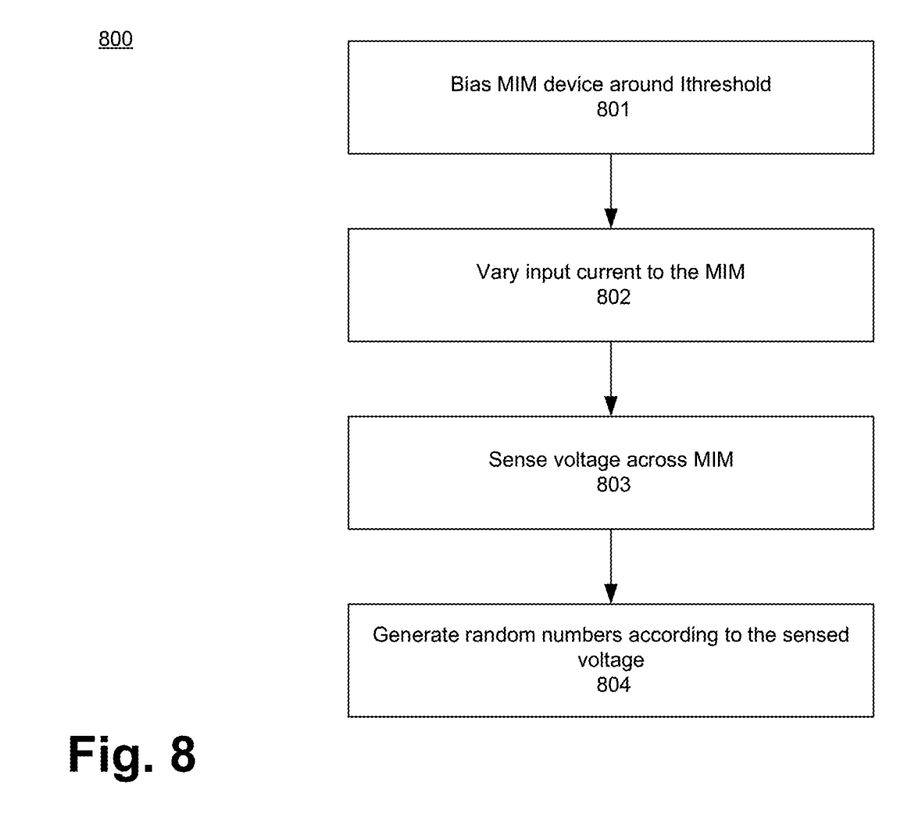
FIG. 8 illustrates a flowchart of a method for generating random numbers using the S-shaped NDR device, according to some embodiments of the disclosure.

FIG. 8 illustrates flowchart 800 of a method for generating random numbers using the S-shaped NDR device, according to some embodiments of the disclosure. It is pointed out that those elements of FIG. 8 having the same reference numbers (or names) as the elements of any other figure can operate or function in any manner similar to that described, but are not limited to such.

Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 801, MIM device 701 is biased around $I_{threshold}$. By biasing MIM device 701 near its current threshold ($I_{threshold}$), MIM device 701 is operable to oscillate between ON and OFF states in a random fashion. At block 802, input current to MIM device 701 is varied by Current Source 703 to change the voltage $V_{meas}$ across MIM device 701. At block 803, $V_{meas}$ is sensed by Logic 702 that uses the random change in $V_{meas}$ from $V_{hold}$ to $V_{th}$ states to generate random numbers. At block 804, Logic 702 generates random numbers according to randomly changing of $V_{meas}$ from $V_{hold}$.

Figure 9:
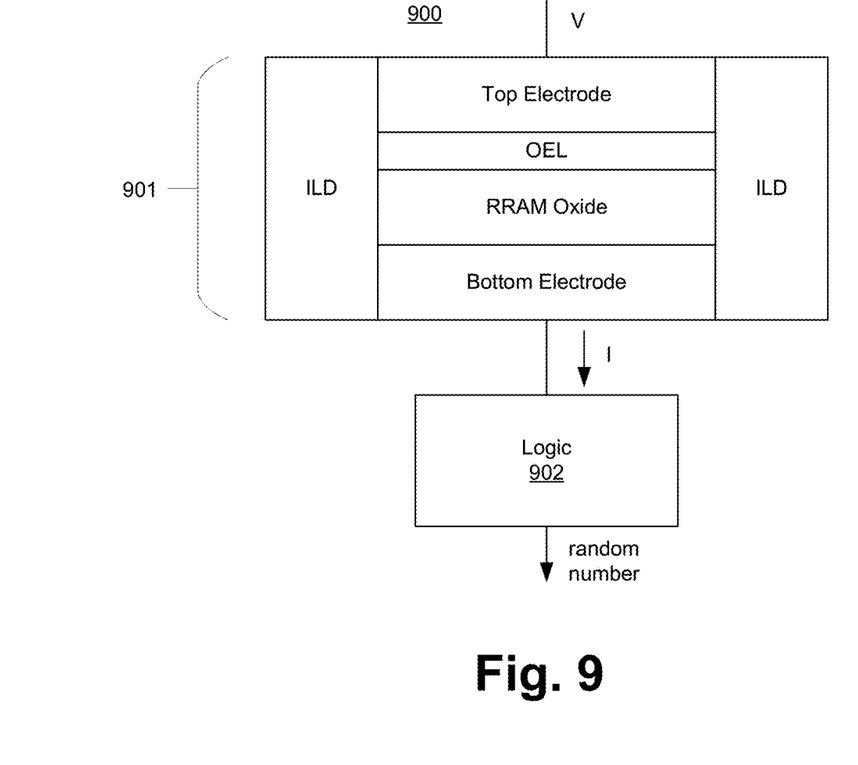
FIG. 9 illustrates a random number generator using a Metal-Insulator-Metal (MIM) device, according to some embodiments of the disclosure.

FIG. 9 illustrates random number generator 900 using a MIM device, according to some embodiments of the disclosure. In some embodiments, random number generator 900 comprises MIM device 901 and Logic 902. In some embodiments, MIM device 901 is a resistive random access memory (RRAM) device. In some embodiments, the insulator of MIM device 901 is made of chalcogenide oxide. In some embodiments, MIM device 901 comprises an oxide layer (e.g., RRAM Oxide), Oxygen Exchange Layer (OEL), and Top and Bottom electrodes (e.g., Cu layers), where the oxide layers, OEL, and the electrodes are partially surrounded by Inter-Layer Dielectric (ILD). Typical materials used for OEL are sub-stoichiometric oxides of transition metal such as Hafnium oxide $HfO_x$, Tantalum oxide $TaO_x$, Tungsten oxide $WO_x$, Titanium oxide $TiO_x$, where 'x' is a number.

In some embodiments, MIM device 901 is biased in a high resistance state. As such, in some embodiments, random telegraphic noise in the current 'I' is observed by Logic 902. In some embodiments, Logic 902 uses this random telegraphic noise in the current 'I' to generate random numbers using any suitable random number generator circuit.

Figure 10:
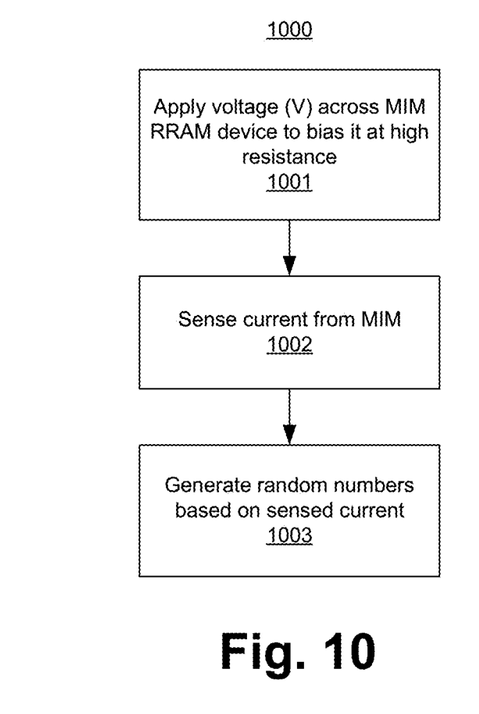
FIG. 10 illustrates a flowchart of a method for generating random numbers using the MIM device, according to some embodiments of the disclosure.

FIG. 10 illustrates flowchart 1000 of a method for generating random numbers using MIM device 901, according to some embodiments of the disclosure. It is pointed out that those elements of FIG. 10 having the same reference numbers (or names) as the elements of any other figure can operate or function in any manner similar to that described, but are not limited to such.

Although the blocks in the flowchart with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1001, voltage 'V' is applied across MIM device 901 to bias it at a high resistance. At block 1002, current 'I' from MIM device 901 is sensed by Logic 902. At block 1003, Logic 902 uses the random current 'I' as a seed for generating random numbers using any suitable random generator circuit.

Figure 11:
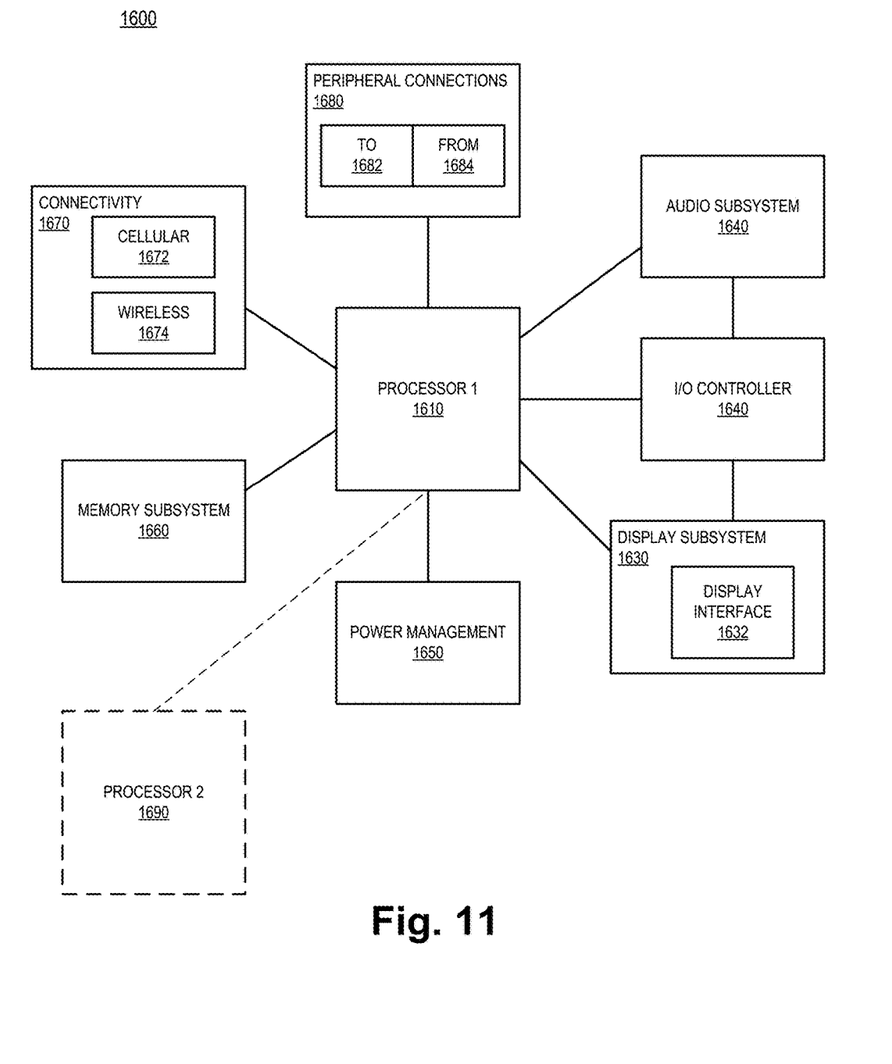
FIG. 11 illustrates a smart device or a computer system or a SoC (System-on-Chip) with a random number generator, according to some embodiments.

FIG. 11 illustrates a smart device or a computer system or a SoC (System-on-Chip) with a random number generator, according to some embodiments. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a random number generator, according to some embodiments discussed. Other blocks of the computing device 1600 may also include a random number generator, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a magnetic tunneling junction (MTJ) device with out-of-plane magnetizations for its free and fixed magnetic layers, and configured to have a magnetization offset away from a center and closer to a switching threshold of the MTJ device; and logic for generating random numbers according to a resistive state of the MTJ device. In some embodiments, the apparatus comprises an excitation source which is operable to cause the free magnetic layer of the MTJ device to switch from a first resistive state to a second resistive state. In some embodiments, the apparatus comprises: a first terminal coupled to the free magnetic layer, and a second terminal coupled to the fixed magnetic layer.

In some embodiments, the excitation source is coupled to the first terminal, and wherein the excitation source is operable to inject spin current to the free magnetic layer. In some embodiments, the second terminal is coupled to ground. In some embodiments, the logic is coupled to the first terminal. In some embodiments, the logic includes a sensor to sense the resistive state of the MTJ device. In some embodiments, the first resistive state is an anti-parallel state where directions of the out-of-plane magnetizations of the free and fixed magnetizations are anti-parallel to one another.

In some embodiments, the second resistive state is a parallel state where directions of the out-of-plane magnetizations of the free and fixed magnetizations are parallel to one another. In some embodiments, the excitation source is operable to initialize the resistive state of the MTJ device to the first resistive state. In some embodiments, the MTJ device to switch from the second resistive state to the first resistive state due to thermal energy. In some embodiments, the size of the MTJ device is suitable enough to cause the MTJ device to switch randomly from a first resistive state to a second resistive state or from the second resistive state to the first resistive state due to thermal energy. In some embodiments, the magnetization offset is adjustable by increasing or decreasing a number of layers forming the fixed magnetic layer.

In another example, a system is provided which comprises: a memory; a processor coupled to the memory, the processor including a random number generator having an apparatus according to the apparatus described above; and a wireless interface for allowing the processor to communicate with another device.

In another example, a method is provided which comprises: setting a resistive state of a magnetic tunneling junction (MTJ) device to a first resistive state, the MTJ device with out-of-plane magnetizations for its free and fixed magnetic layers and configured to have a magnetization offset away from a center and closer to a switching threshold of the MTJ device; exciting the MTJ device to cause it to change the resistive state from the first resistive state to a second resistive state; and generating, in response to exciting, a random number when the resistive state of the MTJ device changes from the second resistive state to the first resistive state.

In some embodiments, exciting the MTJ device comprises causing the free magnetic layer of the MTJ device to switch from the first resistive state to the second resistive state. In some embodiments, the method comprises sensing the resistive state of the MTJ device for generating the random number. In some embodiments, the first resistive state is an anti-parallel state where directions of the out-of-plane magnetizations of the free and fixed magnetizations are anti-parallel to one another, and wherein the second resistive state is a parallel state where directions of the out-of-plane magnetizations of the free and fixed magnetizations are parallel to one another. In some embodiments, the method comprises initializing the resistive state of the MTJ device to the first resistive state. In some embodiments, comprises causing the second resistive state to switch to the first resistive state via thermal energy.

In another example, an apparatus is provided which comprises: a metal-insulator-metal (MIM) device that exhibits S-shaped negative differential resistance, wherein the MIM device is biased at its threshold current; and; logic coupled to the MIM device to sense voltage across the MIM device and to generate random numbers according to the sensed voltage. In some embodiments, the apparatus comprises an excitation source coupled to the MIM device, wherein the excitation source is operable to vary current input to the MIM device. In some embodiments, the threshold current is a current level around which the MIM device randomly turns on and off.

In another example, a system is provided which comprises: a memory; a processor coupled to the memory, the processor including a random number generator having an apparatus according to the apparatus described above; and a wireless interface for allowing the processor to communicate with another device.

In another example, an apparatus is provided which comprises: a metal-insulator-metal (MIM) device biased at a high resistance state; and; logic coupled to the MIM device to sense current through the MIM device and to generate random numbers according to the sensed current. In some embodiments, the MIM device is a resistive random access memory device.

In another example, a system is provided which comprises: a memory; a processor coupled to the memory, the processor including a random number generator having an apparatus according to the apparatus described above; and a wireless interface for allowing the processor to communicate with another device.

In another example, an apparatus is provided which comprises: means for setting a resistive state of a magnetic tunneling junction (MTJ) device to a first resistive state, the MTJ device with out-of-plane magnetizations for its free and fixed magnetic layers and configured to have a magnetization offset away from a center and closer to a switching threshold of the MTJ device; means for exciting the MTJ device to cause it to change the resistive state from the first resistive state to a second resistive state; and means for generating, in response to exciting, a random number when the resistive state of the MTJ device changes from the second resistive state to the first resistive state.

In some embodiments, the means for exciting the MTJ device comprises means for causing the free magnetic layer of the MTJ device to switch from the first resistive state to the second resistive state. In some embodiments, the apparatus comprises means for sensing the resistive state of the MTJ device for generating the random number. In some embodiments, the first resistive state is an anti-parallel state where directions of the out-of-plane magnetizations of the free and fixed magnetizations are anti-parallel to one another, and wherein the second resistive state is a parallel state where directions of the out-of-plane magnetizations of the free and fixed magnetizations are parallel to one another.

In some embodiments, the apparatus comprises: means for initializing the resistive state of the MTJ device to the first resistive state. In some embodiments, the apparatus comprises means for causing the second resistive state to switch to the first resistive state via thermal energy.

In another example, a system is provided which comprises: a memory; a processor coupled to the memory, the processor including a random number generator having an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a magnetic junction including fixed and free magnetic structures with out-of-plane magnetizations, wherein the magnetic junction is to have a magnetization offset away from a center and closer to a switching threshold of the magnetic junction such that the magnetic junction is to switch from a first resistive state to a second resistive state by thermal energy, wherein the magnetization offset is adjustable by a change in a number of layers of the fixed magnetic structure or by a change in a diameter of the fixed magnetic structure, and wherein the magnetization offset is non-zero;
    logic having a first terminal coupled to the free magnetic structure via a first electrode, and a second terminal coupled to the fixed magnetic structure via a second electrode, wherein the logic is to generate random numbers according to the first or second resistive state of the magnetic junction; and
    a bias circuit to bias the magnetic junction, wherein the bias circuit is to adjust the bias to change randomness of switching current sensed by the logic.

2. The apparatus of claim 1 comprises an excitation source which is to cause the free magnetic structure of the magnetic junction to switch from the first resistive state to the second resistive state.

3. The apparatus of claim 2, wherein the excitation source is coupled to the first terminal, and wherein the excitation source is operable to inject spin current to the free magnetic structure.

4. The apparatus of claim 3, wherein the second terminal is coupled to ground.

5. The apparatus of claim 4, wherein the first resistive state is an anti-parallel state where directions of the out-of-plane magnetizations of the free and fixed magnetizations are anti-parallel to one another.

6. The apparatus of claim 5, wherein the second resistive state is a parallel state where directions of the out-of-plane magnetizations of the free and fixed magnetic structures are parallel to one another.

7. The apparatus of claim 5, wherein the excitation source is to initialize a resistive state of the magnetic junction to the first resistive state.

8. The apparatus of claim 2, wherein the logic includes a sensor to sense the first and second resistive states of the magnetic junction.

9. A method comprising:
    setting a resistive state of a magnetic tunneling junction (MTJ) device to a first resistive state, the MTJ device with out-of-plane magnetizations for its free and fixed magnetic layers and configured to have a magnetization offset away from a center and closer to a switching threshold of the MTJ device, wherein the magnetization offset is adjustable by a change in a number of layers of the fixed magnetic structure or by a change in a diameter of the fixed magnetic structure, and wherein the magnetization offset is non-zero;

exciting the MTJ device to cause it to change a resistive state of the MTJ from the first resistive state to a second resistive state;

generating, in response to exciting, a random number when the resistive state of the MTJ device changes from the second resistive state to the first resistive state by thermal energy;

biasing to bias the MTJ to change randomness of switching current sensed by the logic.

10. The method of claim 9, wherein exciting the MTJ device comprises causing the free magnetic layer of the MTJ device to switch from the first resistive state to the second resistive state.

11. The method of claim 9 comprises sensing the resistive state of the MTJ device for generating the random number.

12. The method of claim 9, wherein the first resistive state is an anti-parallel state where directions of the out-of-plane magnetizations of the free and fixed magnetizations are anti-parallel to one another, and wherein the second resistive state is a parallel state where directions of the out-of-plane magnetizations of the free and fixed magnetizations are parallel to one another.

13. The method of claim 9 comprises initializing the resistive state of the MTJ device to the first resistive state.

14. A system comprising:

a memory;

a processor coupled to the memory, the processor including a random number generator having an apparatus which includes:

a magnetic tunneling junction (MTJ) device with out-of-plane magnetizations for its free and fixed magnetic layers, and configured to have a magnetization offset away from a center and closer to a switching threshold of the MTJ device such that a resistive state of the MTJ is to switch from a first resistive state to a second resistive state by thermal relaxation, wherein the magnetization offset is adjustable by a change in a number of layers of the fixed magnetic structure or by a change in a diameter of the fixed magnetic structure, and wherein the magnetization offset is non-zero;

logic to generate random numbers according to the resistive state of the MTJ device;

a bias circuit to bias the magnetic junction, wherein the bias circuit is to adjust the bias to change randomness of switching current sensed by the logic; and a wireless interface to allow the processor to communicate with another device.

* * * * *